(12) United States Patent
Kim et al.

(10) Patent No.: US 12,136,588 B2
(45) Date of Patent: Nov. 5, 2024

(54) HEAT SLUG ATTACHED TO A DIE PAD FOR SEMICONDUCTOR PACKAGE

(71) Applicant: Texas Instruments Incorporated, Dallas, TX (US)

(72) Inventors: Woochan Kim, San Jose, CA (US); Vivek Kishorechand Arora, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/379,934

(22) Filed: Jul. 19, 2021

(65) Prior Publication Data
US 2023/0015323 A1    Jan. 19, 2023

(51) Int. Cl.
*H01L 23/495* (2006.01)
*H01L 21/48* (2006.01)
*H01L 21/56* (2006.01)
*H01L 23/00* (2006.01)
*H01L 23/31* (2006.01)
*H01L 23/482* (2006.01)

(52) U.S. Cl.
CPC .... *H01L 23/49568* (2013.01); *H01L 21/4825* (2013.01); *H01L 21/565* (2013.01); *H01L 23/3107* (2013.01); *H01L 23/4825* (2013.01); *H01L 23/49503* (2013.01); *H01L 23/49513* (2013.01); *H01L 23/4952* (2013.01); *H01L 23/49541* (2013.01); *H01L 23/49562* (2013.01); *H01L 23/49575* (2013.01); *H01L 24/46* (2013.01); *H01L 24/49* (2013.01); *H01L 2924/181* (2013.01)

(58) Field of Classification Search
CPC ........... H01L 25/0562; H01L 23/49503; H01L 21/4825; H01L 21/565; H01L 24/46; H01L 24/49; H01L 23/49568; H01L 23/3107; H01L 23/49513; H01L 23/4952; H01L 23/49562; H01L 23/49575; H01L 23/49541; H01L 2924/181
See application file for complete search history.

(56) References Cited

U.S. PATENT DOCUMENTS 5,216,283 A * 6/1993 Lin ..................... H01L 23/4334
                                                      257/796
5,397,746 A * 3/1995 Blish, II .............. H01L 23/4334
                                                      257/E23.092

(Continued)

*Primary Examiner* — Alonzo Chambliss
(74) *Attorney, Agent, or Firm* — Ronald O. Neerings; Frank D. Cimino

(57) ABSTRACT

A semiconductor package includes a leadframe including leads and a die attach pad (DAP) inside the leads, and at least one semiconductor die having a top side including circuitry electrically connected to bond pads and a bottom side attached to a bottom side portion of the DAP. The package includes a mold compound and a heat slug having a top side and a bottom side positioned within a cavity defined by sidewalls of the mold compound. The heat slug has an area greater than an area of the DAP is attached by its bottom side with a thermally conductive adhesive material to a top side portion of the DAP. Bondwires are between the leads and the bond pads. Exposed from the mold compound is a bottom side surfaces of the leads and the top side of the heat slug.

26 Claims, 3 Drawing Sheets

(56) References Cited

U.S. PATENT DOCUMENTS

| | | | | |
|---|---|---|---|---|
| 5,422,313 | A | * | 6/1995 | West .................. H01L 24/32 |
| | | | | 257/E23.09 |
| 8,048,714 | B2 | * | 11/2011 | Chou ................ H01L 23/4334 |
| | | | | 257/E23.128 |
| 2005/0104168 | A1 | * | 5/2005 | Choi ............... H01L 23/49568 |
| | | | | 257/E23.128 |
| 2009/0039483 | A1 | | 2/2009 | Chang et al. |
| 2012/0013001 | A1 | * | 1/2012 | Haba .................. H01L 25/50 |
| | | | | 257/737 |
| 2012/0074549 | A1 | * | 3/2012 | Yow ................ H01L 23/3107 |
| | | | | 257/676 |
| 2015/0243588 | A1 | * | 8/2015 | Edwards ............ H01L 21/4825 |
| | | | | 257/670 |
| 2016/0148918 | A1 | * | 5/2016 | Ye .................. H01L 23/3128 |
| | | | | 438/107 |
| 2022/0208661 | A1 | * | 6/2022 | Zhang ............. H01L 23/49551 |

\* cited by examiner

HEAT SLUG ATTACHED TO A DIE PAD FOR SEMICONDUCTOR PACKAGE

FIELD

This Disclosure relates to semiconductor packages that have features on its top side for enhanced cooling of the package.

BACKGROUND

Gallium nitride (GaN) transistors or silicon carbide (SIC) transistors including metal oxide semiconductor field effect transistors (MOSFETs) or insulated gate bipolar transistors (IGBT's) can switch significantly faster as compared to silicon-based transistors (MOSFETs), which offers the potential for reduced switching losses. GaN and SiC-based transistors and ICs therefrom including such transistors are currently used for a wide range of applications that need fast switching including telecommunications, servers, motor drives, laptop adapters, and on-board chargers for electric vehicle battery packs.

A challenge for a power device, such as a GaN or SiC-based power device, is regarding packaging which involves embedding a small area die that includes at least one power transistor, typically being an IC die into as small size package as possible while dissipating as much power as possible. The limitation of the package size comes from GaN's and SiC's unique need for ultra-low parasitic inductance for providing a high switching frequency. Accordingly, enhanced heat sinking for a given GaN or SiC package area is a significant design feature for such packages. Heat sinking can occur at both the top side and the bottom side of the semiconductor package.

A conventional GaN or SiC package can comprise a Thin Small Quad Flat Non-leaded (tsQFN), which includes a leadframe including leads and a die attach pad (DAP) having a bottom side, with at least one semiconductor die mounted with its back side thereon, where the DAP opposite the semiconductor die is exposed on the top side of the semiconductor package from the mold compound, where the DAP in this configuration may be referred to as being a heat slug (or as a heat spreader) The DAP helps equalize the temperature across the area of the semiconductor die.

The die attach adhesive can comprise a thermally conductive material to improve cooling from the semiconductor die to the top side of the package. For example, the die attach adhesive can comprise silver SiC particle filled epoxy, silver sinter, solder, or a thermally conductive film. There are bondwires from the bond pads on the semiconductor die to the respective leads of the package which can be exposed at the bottom of the package.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize for semiconductor die, such as power die comprising power transistors, or example for GaN or SiC-based devices, particularly for lateral power FETs, the thermal contact area to the semiconductor die is small resulting in ineffective heat dissipation. Disclosed aspects provide a solution to this problem by providing enhanced heat dissipation that can improve the cooling performance of the semiconductor die. Disclosed aspects apply to both lateral and vertical FETs, and overcome the limitations of conventional semiconductor packages described above by providing an open cavity (cavity) in the mold compound at the top of the semiconductor package during the molding step that exposes an area that includes a top side of the DAP. The exposed area of the cavity is larger as compared to an area of the DAP.

The cavity is sized to accommodate therein a heat slug that comprises a flat metal feature, such as comprising copper. The cavity can have an area that spans essentially the entire area on a top side of the package only excluding a mold cavity sidewall that may be at least 100 μm in thickness to help minimize mold cracking.

Disclosed aspects include a semiconductor package comprising a leadframe including leads and a DAP positioned inside the leads. At least one semiconductor die has a top side including circuitry electrically connected to bond pads and a bottom side attached to a bottom side portion of the DAP. A mold compound encapsulates the semiconductor die. A heat slug having a top side and a bottom side is positioned within a cavity defined by sidewalls of the mold compound. The heat slug has an area greater than an area of the DAP, and the heat slug is attached by its bottom side with a thermally conductive material to a top side portion of the DAP. There are bondwires between the leads and the bond pads. Exposed from the mold compound is a bottom side surfaces of the leads, and the top side of the heat slug.

BRIEF DESCRIPTION OF THE DRAWINGS

Reference will now be made to the accompanying drawings, which are not necessarily drawn to scale, wherein:

FIG. 1A shows results after a molding process that forms a mold compound, where a T-shaped top mold chase, which can also be considered a mold cavity bar, that can be utilized for the molding process. A top mold chase with a cavity bar results in the molding process forming an indentation (cavity) on top of the package that exposes the DAP after the molding process to enable placing a heat slug on a top side the DAP. FIG. 1B shows results after removing the top mold chase and the bottom mold plate. FIG. 1C shows results after dispensing an adhesive material into the mold cavity. FIG. 1D shows results after dropping in a heat slug on the adhesive material to fill the mold cavity.

DETAILED DESCRIPTION

Figure 1A:
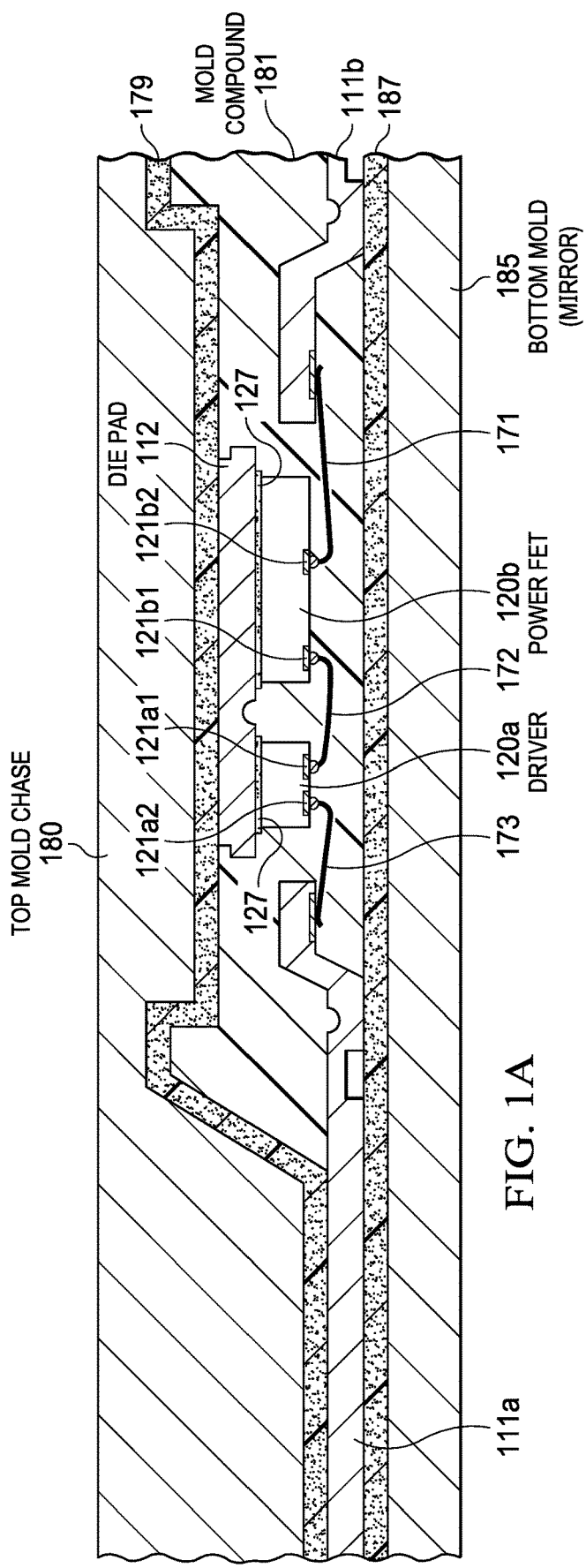
FIGS. 1A-1D are successive cross-sectional views of an in-process semiconductor package after various steps in a disclosed assembly method for forming a semiconductor package including a semiconductor die and a disclosed heat slug on a DAP, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

Disclosed aspects recognize a limitation for the conventional GaN or SiC package arrangement described above in the Background is that the area of the DAP is limited to be significantly less as compared to area of the package due to the need for the DAP to be offset from the leads needed to provide enough space to reliably enable wirebonding. Accordingly, the top side of the semiconductor package for such conventional semiconductor packages is only partially utilized for heat spreading. In another known semiconductor package arrangement, a clip comprising a metal typically being copper is also provided, where the clip has an angled foot that electrically connects a bond pad on the semiconductor die. However, in this arrangement, the semiconductor die must be limited to vertical FETs that have relatively large bond pads to enable attachment of the clip.

A vertical FET die has its entire bottom surface as its drain, most of the top surface as its source, and a relatively small pad for its gate. This is ideal condition to attach a large size source contacting clip on topside of die, and also to expose the outside of package for heat sinking. In the case of a lateral FET all three device terminals (drain, source, and gate) are on the topside of semiconductor die. For the lateral FET it is recognized that clip attachment is more difficult as compared to attachment to a vertical FET device. Moreover, even if clips are utilized for a lateral FET device, a thermal contact area to the semiconductor die is small so that the heat dissipation provided will generally not be sufficient for the semiconductor package.

Figure 1B:
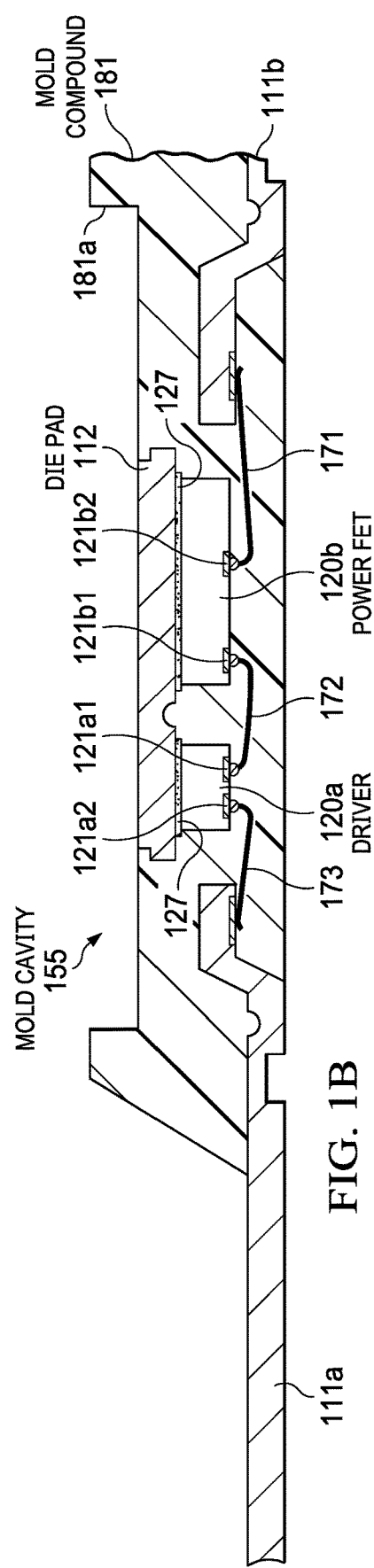
Figure 1C:
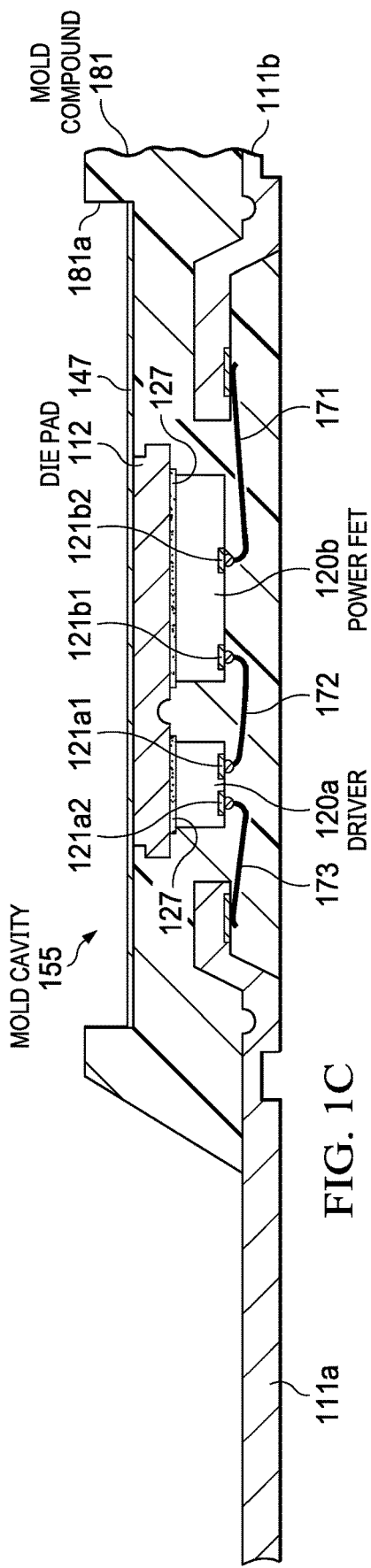
Figure 1D:
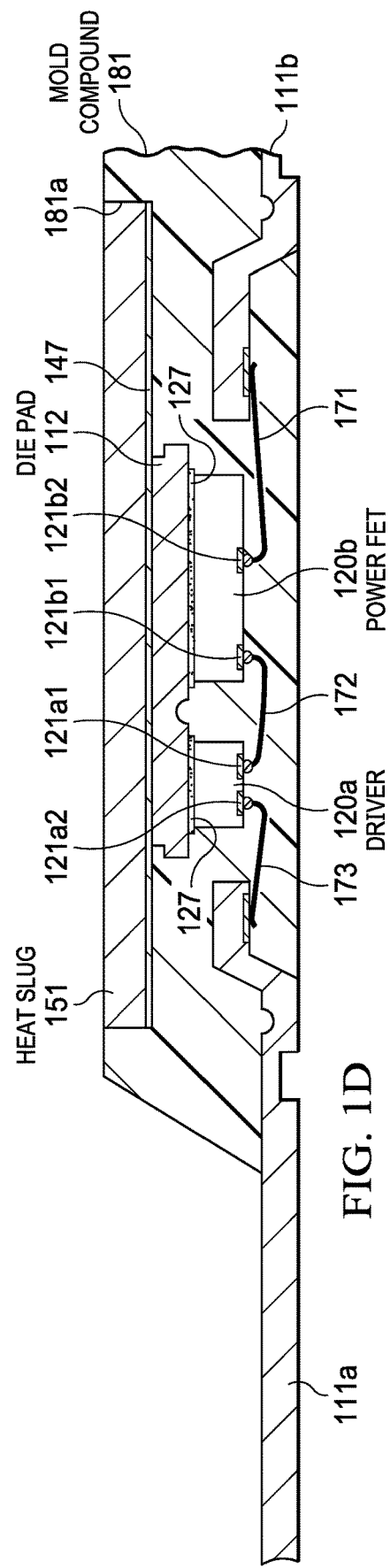
Figure 2:
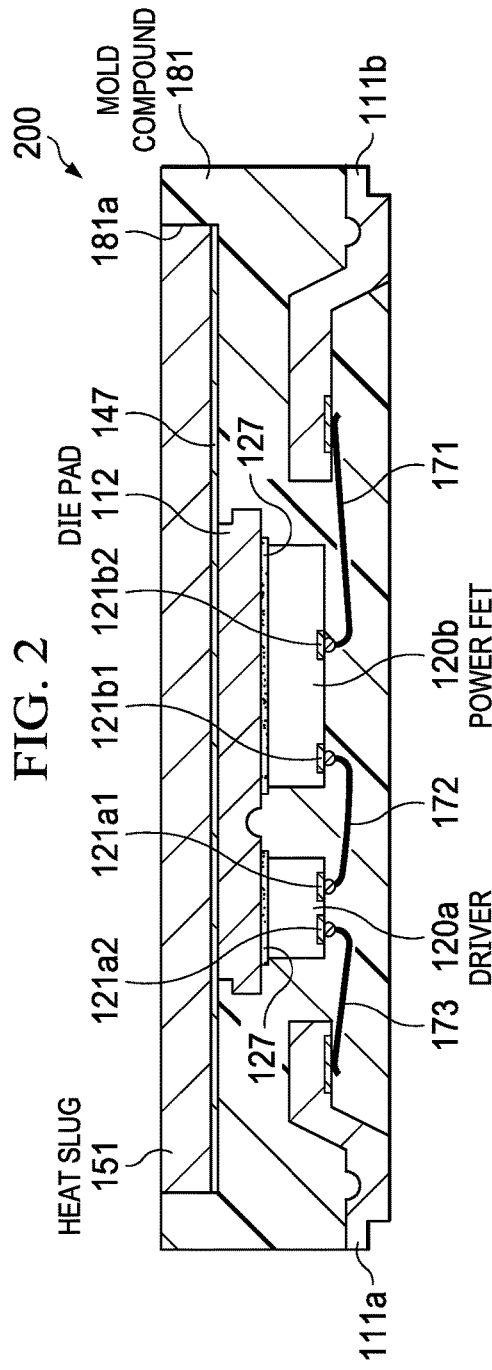
FIG. 2 is a cross-sectional view of a single disclosed semiconductor package resulting from a package saw process of a leadframe sheet comprising a plurality of in-process semiconductor package shown in FIG. 1D, according to an example aspect. Multiple ones of the semiconductor package can be formed together in a sheet and singulated at this stage to separate individual package units using, for example, mechanical or laser sawing.

FIGS. 1A-1D are cross-sectional views after successive steps in a disclosed assembly method for forming a semiconductor package including a top mold chase to provide a cavity in the mold compound configured to receive a disclosed heat slug on the top side of the DAP opposite a semiconductor die in the package shown in FIG. 2 as semiconductor package 200. The semiconductor die can comprise an integrated circuit (IC) die, a discrete FET die, or be part of a multichip module (MCM) including two or more semiconductor die. Although not shown, multiple ones of the semiconductor package 200 shown in FIG. 2 can be simultaneously processed together in sheet form and then singulated to separate out individual semiconductor packages units using, for example, mechanical or laser sawing.

FIG. 1A shows results for in-process semiconductor package after a molding process that forms a mold compound 181, where the molding process utilizes a top mold chase 180 shown by example including a T-shaped top mold cavity bar. The top mold chase 180 with a cavity bar results in the molding process forming an indentation in the mold compound (referred to herein as being a mold cavity) at the top of the semiconductor package that exposes the DAP 112 of the leadframe after the molding process. The mold cavity enables placing a disclosed heat slug on the top side DAP 112 opposite at least one semiconductor die shown by example including a first semiconductor die and a second semiconductor die, 120a, 120b. There is also a bottom mold plate 185 shown providing a mirror attached by a bottom adhesive layer 187 to the leads 111a, 111b of the leadframe to enable the molding process to form the mold compound 181 shown. The top mold chase 180 is similarly attached by a top adhesive layer 179 to the DAP 112 which results in the molding process forming a mold cavity shown below in FIG. 1B as 155 above the top surface of the DAP 112. Due to the dimensions of the mold chase 180 the resulting mold cavity will have an area larger than the DAP 112.

The in-process semiconductor package includes a DAP 112 positioned inside the leads 111a, 111b. The semiconductor die 120a, 120b each have a top side including circuitry electrically connected to bond pads shown as 121a1 and 121a2 for the semiconductor die 120a, and bond pads 121b1 and 121b2 for the semiconductor die 120b. In one particular arrangement the semiconductor die 120a can comprise a gate driver and the semiconductor die 120b can comprise a power FET die, where the gate driver is configured to drive the gates of the power FETs.

A bottom side of the respective semiconductor die 120a, 120b are each attached by a die attach material 127 to a bottom side of the DAP 112. The die attach material 127 can be a thermally conductive die attach material. There are bondwires shown including a bond wire 171 between the lead 111b and the bond pad 121b, a bond wire 172 between bond pad 121b1 and the bond pad 121a1, and a bond wire 173 between the bond pad 121a2 and the lead 111a. As noted above, although two semiconductor die 120a, 120b are shown, disclosed semiconductor packages can include a single die. The circuitry on the semiconductor die 120a, 120b comprises circuit elements (including transistors, and generally diodes, resistors, capacitors, etc.) that can optionally be formed in an epitaxial layer on the bulk substrate material such as silicon, where the circuitry is configured together for generally realizing at least one circuit function.

Before the molding process, at least one semiconductor die, shown by example as semiconductor die 120a and 120b, are attached to a bottom side of the DAP 112. The wirebonding process can position the respective bond wires 171, 172, 173. The first and second semiconductor die 120a, 120b as described above in the MCM arrangement can in one specific arrangement comprise a gate driver and a GaN power transistor die, respectively. As illustrated in FIG. 1A, both the first and second semiconductor die 120a and 120b are mounted on a DAP 112, and then later a disclosed heat slug is mounted in the mold cavity formed on top of DAP 112. Accordingly, a single heat slug provides enhanced cooling for both of the semiconductor die 120a, 120b.

Adhesive layers shown as 179 and 187 respectively, are applied between the in-process semiconductor package and the top mold cavity bar 180 at the top of the semiconductor package and the bottom mold plate 180 on the bottom of the in-process semiconductor package, respectively. The adhesive layers 179, 187 can comprise conventional adhesive layers.

FIG. 1B shows results for the in-process semiconductor package after removing the respective adhesive layers 179, 187 as well as the top mold chase 180 and the bottom mold plate 185. A mold cavity 155 defined by sidewalls 181a of the mold compound 181 is shown. The sidewalls 181a of the mold cavity 155 are generally at least 100 μm thick, such as at least 500 µm thick, to help avoid cracking of the mold compound 181 along the sidewalls 181a.

FIG. 1C shows results after for the in-process semiconductor package after dispensing an adhesive material 147 into the mold cavity 155 including over a top surface of the DAP 112. The adhesive material 147 generally comprises a thermally conductive material defined herein to have a room temperature (25° C.) thermal conductivity of at least 10 W/m·K, such as a silver particle filled epoxy or a solder material. FIG. 1D shows results after for the in-process semiconductor package after positioning a heat slug 151 that generally comprises copper or aluminum onto the adhesive material 147 to fill within the mold cavity 155. The thickness of heat slug 151 can be controlled by processing raw material to match the depth (height) of the mold cavity 155.

There are various apparatus able to align the heat slug 151 into the mold cavity 155. For example, a die bonder or a pick-and-place tool may be used. Molded units will be still generally in a leadframe strip (or panel) format, and the die bonder can detect the index mark on leadframe. Then the die bonder or pick and place tool can position the heat slug 151 into the mold cavity 155 using a programmed location based on the index point of the leadframe being used. The heat slug 151 is generally attached to a top side of the DAP 112 using an adhesive material 147.

The adhesive material 147 can comprise a thermally conductive adhesive material defined herein to have thermal conductivity at 25° C. of at least 10 W/m·K. For example, the thermally conductive material can comprise silver filled epoxy or solder that generally has thermal conductivity significantly greater than 10 W/m·K. The adhesive material 147 can also comprise a thermally conductive (electrically) insulating layer (TCIL) which is a popular adhesive product which enables bonding one metal feature to another matter feature, for disclosed aspects being bonding a heat slug to a DAP. The heat slug and the DAP can both comprise the same material, such as copper.

The heat slug 151 can be seen to have an area greater than that of the DAP 112 to take advantage of a larger heat spreading area. The area of the heat slug 151 is generally determined by how much mold sidewall 181a thickness is needed to avoid a mechanical stability (cracking) issue. For example, one can utilize a 0.5 mm thick mold sidewall 181a and utilize the remaining area for a mold cavity to enable placement of a drop-in heat slug 151 in the mold cavity 155.

FIG. 2 a cross-sectional view of a disclosed semiconductor package 200 resulting from a package saw process of a leadframe sheet including a plurality of the in-process semiconductor package shown in FIG. 1D, according to an example aspect. As described above multiple ones of the semiconductor package 200 can be formed together in a sheet and singulated at this stage to separate individual package units using, for example, by mechanical or laser sawing.

A disclosed semiconductor package assembly method can comprise forming a mold compound including forming an open mold cavity framed by sidewalls of a mold compound. A heat slug is positioned in the mold cavity and is secured to the DAP using an adhesive material. The top mold chase has a design that creates a cavity on top of the package after the molding process. There are several methods to enable this mold cavity feature.

For example, the arrangement can comprise an additional mold cavity insert on a top mold chase, or the mold chase itself can be designed to create such a mold cavity. The mold cavity is sized to accommodate therein a heat slug that generally comprises a flat metal feature, such as comprising copper or aluminum. The mold cavity, and as a result the heat slug within the mold cavity, can have an area that spans essentially the entire area on a top side of the semiconductor package excluding the mold cavity's sidewall that is described above is generally at least 100 µm in thickness.

The sidewalls of the mold cavity as described above is generally at least 100 µm, such as at least 500 µm thick, to have sufficient mechanical strength to help avoid mold compound cracking. During the assembly process a heat slug is dropped-(placed) into the mold cavity. There are various alignment methods to be able to drop in the heat slug into the mold cavity. For example, a die bonder or a pick-and-place tool may be used. Molded semiconductor package units will be still generally in a leadframe strip (or panel) format, and the die bonder can detect the index mark on leadframe. Then the die bonder can place a heat slug into the cavity using a program location based on the index point of the leadframe. A heat slug may for example be attached to the DAP using a thermally conductive adhesive material.

Alternatively, a process comprising laser ablation can be used to form the cavity in a mold compound. A disclosed heat spreader on the DAP due to the larger area of the heat spreader compared to the DAP as noted above helps assure an improved level of temperature uniformity across thy: area of the semiconductor die.

A conventional molding process can be used to form the mold cavity 155 on topside of the in-process semiconductor package and expose a top side of the DAP 112 to function as a thermal pad. Alternatively, one can leave a thin layer of mold compound to have side-by-side electrically isolated DAPs for each of the semiconductor die shown in FIG. 2. By attaching a disclosed heat slug 151 on the exposed top surface of the DAP 112, the heat slug 151 will have the same electrical conductivity as the DAP. This means that the mold compound, which generally comprises an epoxy material which typically comprises an electrically insulating material, will cover up the DAP 112, and the heat slug 151 will be adhered to the DAP 112 by a suitable adhesive on top of that thin layer of mold compound. This way, by using a thermally conductive but electrically insulating adhesive material as the adhesive material 147, the heat slug 151 can be electrically isolated from the DAP 112. Some power applications generally prefer to have electrically isolated DAPs to electrically isolate the respective die.

Then an adhesive material 147, such as comprising solder, conductive epoxy, or Ag-sinter, can be dispensed onto the DAP where the heat slug 151 will be placed. This disclosed assembly process results in the heat slug 151 having a larger area as compared to the area of the DAP 112 so that the heat spreading area, and thus the cooling efficiency out the top side of the semiconductor package, can be maximized in a given package size.

Disclosed aspects are compatible with existing topside QFN assembly process with only a modified molding process, and only one extra heat slug attachment step. Based on a simulated thermal analysis, the thermal resistance of the semiconductor package can be reduced by at least 20% as described below in the Example by adding a disclosed heat slug into a mold cavity above the DAP in the same package body size.

EXAMPLES

Disclosed aspects are further illustrated by the following specific Examples, which should not be construed as limiting the scope or content of this Disclosure in any way.

Figure 3:
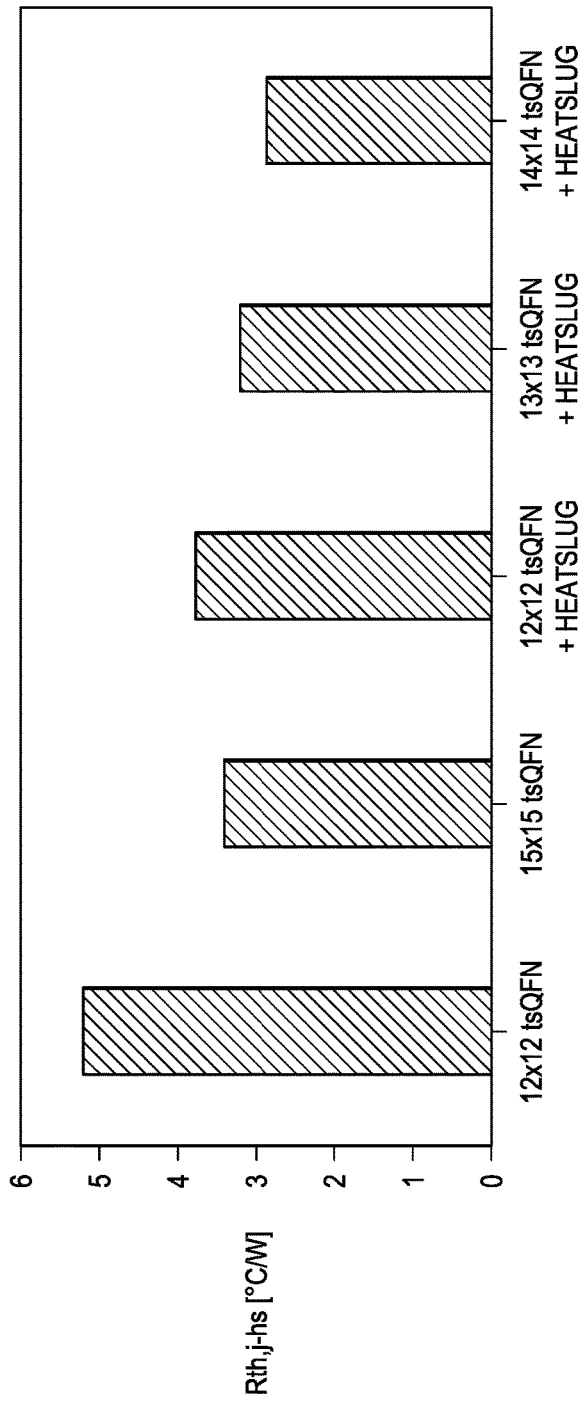
FIG. 3 shows comparative thermal simulation results for some known tsQFN packages as compared to some disclosed tsQFN packages that include a heat slug on the DAP opposite the semiconductor die.

FIG. 3 shows comparative thermal simulation results for some known tsQFN packages with GaN die as compared to some disclosed tsQFN packages that include the same GaN die and a disclosed heat slug positioned in a mold cavity on the topside of the DAP. The parameter on the y-axis is shown as Rth,j-hs (° C./W), where 'j-hs' stands for the die junction to the heatsink. Over a 20% improvement (a reduction) in this parameter is shown in the case of a 52 pin tsQFN package (shown as 12×12 tsQFN), which results in a significantly lower semiconductor die temperature during operation.

Disclosed aspects can be integrated into a variety of assembly flows to form a variety of different semiconductor packages and related products. The semiconductor package can comprise single IC die or multiple IC die, such as configurations comprising a plurality of stacked IC die, or laterally positioned IC die. A variety of package substrates may be used. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A semiconductor package, comprising:
a leadframe including leads and a die attach pad (DAP) inside the leads;
at least one semiconductor die having a top side including circuitry electrically connected to bond pads and a bottom side that is attached to a bottom side portion of the DAP;
a mold compound encapsulating the semiconductor die;
a heat slug having a top side and a bottom side completely positioned within a cavity defined by sidewalls of the mold compound, the heat slug having an area greater than an area of the DAP, and attached by its bottom side with a thermally conductive adhesive material to a top side portion of the DAP;
bond wires between the leads and the bond pads; and
wherein exposed from the mold compound is a bottom side surfaces of the leads, and the top side of the heat slug.

2. The semiconductor package of claim 1, wherein the leadframe comprises leads that do not extend outside of the mold compound.

3. The semiconductor package of claim 1, wherein the semiconductor die comprises a gallium nitride (GaN) substrate or a silicon carbide (SiC) substrate.

4. The semiconductor package of claim 3, wherein the semiconductor die comprises an integrated circuit (IC).

5. The semiconductor package of claim 1, wherein an area of the heat slug equals an area of a top side of the semiconductor package defined by the mold compound minus a thickness of the sidewalls.

6. The semiconductor package of claim 1, wherein the leadframe comprises a leaded leadframe.

7. The semiconductor package of claim 1, wherein the thermally conductive material has at least 10 W/m·K of thermal conductivity at 25° C.

8. The semiconductor package of claim 1, wherein the semiconductor die comprises a first field effect transistor (FET) die and a second FET die.

9. The semiconductor package of claim 1, wherein a thickness of the sidewalls is at least 100 µm.

10. The semiconductor package of claim 1, wherein a thickness of the sidewalls between the heat slug and a sidewall surface of the semiconductor package no more than 500 µm.

11. The semiconductor package of claim 1, wherein a thickness of the sidewalls between the heat slug and a sidewall surface of the semiconductor package is at least 100 µm.

12. A method, comprising:
molding around a partially completed semiconductor package to form a mold compound, the partially completed semiconductor package comprising:
a leadframe including leads and a die attach pad (DAP) having a top side and a bottom side opposite the top side within the leads;
at least one semiconductor die having a top side including circuitry electrically connected to bond pads and a bottom side that is attached to the bottom side of the DAP;
bond wires between the leads and the bond pads;
wherein the mold compound provides sidewalls defining an open mold cavity that exposes a topside of the DAP; and
attaching a bottom side of a heat slug having an area greater than the DAP to the top side of the DAP, the heat slug fitting completely within the open mold cavity.

13. The method of claim 12, when forming of the mold cavity comprises the molding using a top mold chase including a cavity bar, further comprising removing the top mold chase before the attaching.

14. The method of claim 13, wherein the top mold chase is a single integrated structure.

15. The method of claim 12, when the forming the open cavity comprises a laser ablation step after the molding.

16. The method of claim 12, wherein the semiconductor die comprises a gallium nitride (GaN) substrate or a silicon carbide (SiC) substrate.

17. The method of claim 12, the semiconductor die comprises a first field effect transistor (FET) die and a second FET die.

18. The method of claim 12, wherein the leadframe comprises leads that do not extend outside of the mold compound.

19. The method of claim 12, wherein an area of the heat slug equals an area of a top side of the semiconductor package defined by the mold compound minus a thickness of the sidewalls.

20. The method of claim 12, wherein the attaching further comprises applying a thermally conductive adhesive material to the top of the DAP; wherein the thermally conductive adhesive material has a thermal conductivity of at least 10 W/m·K at 25° C.

21. The method of claim 12, wherein a thickness of the sidewalls is at least 100 µm.

22. The method of claim 12, wherein the semiconductor die comprises an integrated circuit (IC).

23. The method of claim 12, wherein a thickness of the sidewalls between the heat slug and a sidewall surface of the semiconductor package is no more than 500 µm.

24. The method of claim 12, wherein a thickness of the sidewalls between the heat slug and a sidewall surface of the semiconductor package is at least 100 μm.

25. A semiconductor package, comprising:
   a leadframe including leads and a die attach pad (DAP) inside the leads;
   at least one semiconductor die having a top side including circuitry electrically connected to bond pads and a bottom side that is attached to a bottom side portion of the DAP;
   a mold compound encapsulating the semiconductor die;
   a heat slug having a top side and a bottom side positioned within a cavity having an area greater than an area of the DAP, the cavity defined by sidewalls of the mold compound, the heat slug attached by its bottom side with a thermally conductive adhesive material to a top side portion of the DAP; and
   bond wires between the leads and the bond pads, wherein exposed from the mold compound is a bottom side surfaces of the leads, and the top side of the heat slug.

26. A method, comprising:
   molding around a partially completed semiconductor package to form a mold compound, the partially completed semiconductor package comprising:
      a leadframe including leads and a die attach pad (DAP) having a top side and a bottom side opposite the top side within the leads;
      at least one semiconductor die having a top side including circuitry electrically connected to bond pads and a bottom side that is attached to the bottom side of the DAP;
      bond wires between the leads and the bond pads,
   wherein the mold compound provides sidewalls defines an open mold cavity having an area greater than the DAP that exposes a topside of the DAP, and
   attaching a bottom side of a heat slug to the top side of the DAP.

* * * * *